(12) United States Patent
Zhang

(10) Patent No.: US 9,172,061 B2
(45) Date of Patent: Oct. 27, 2015

(54) ORGANIC LIGHT-EMITTING DIODE (OLED) DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventor: Chunbing Zhang, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 0 days.

(21) Appl. No.: 14/080,943

(22) Filed: Nov. 15, 2013

(65) Prior Publication Data
US 2014/0197388 A1    Jul. 17, 2014

(30) Foreign Application Priority Data
Jan. 11, 2013    (CN) .......................... 2013 1 0011540

(51) Int. Cl.
*H01L 35/24* (2006.01)
*H01L 51/52* (2006.01)
(52) U.S. Cl.
CPC ......... *H01L 51/5271* (2013.01); *H01L 51/5284* (2013.01); *H01L 2251/5323* (2013.01)
(58) Field of Classification Search
CPC ......... H01L 33/50; H01L 33/58; H01L 33/60; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64

USPC ............... 257/12–13, 81, 84, 87–89, 98–100, 257/347–348, 433–434; 313/112, 501, 503, 313/506–507
See application file for complete search history.

(56) References Cited

U.S. PATENT DOCUMENTS

| | | | |
|---|---|---|---|
| 2007/0159043 A1* | 7/2007 | Kubota et al. ................. | 313/110 |
| 2007/0215888 A1* | 9/2007 | Mitsuhashi ..................... | 257/94 |
| 2008/0309224 A1 | 12/2008 | Kwak et al. | |
| 2011/0109596 A1 | 5/2011 | Yoon et al. | |

(Continued)

FOREIGN PATENT DOCUMENTS

| | | |
|---|---|---|
| CN | 1719957 A | 1/2006 |
| CN | 1752800 A | 3/2006 |

(Continued)

OTHER PUBLICATIONS

First Office Action of the State Intellectual Property Office of the People's Republic of China in Application No. CN201310011540.5, issued Nov. 27, 2014; 8 pgs.

(Continued)

*Primary Examiner* — Dung Le

(57) ABSTRACT

An organic light-emitting diode (OLED) display panel comprises: a plurality of pixel units arranged in an array, in which each pixel unit includes an organic light-emitting element provided with a first light-emitting surface and a second light-emitting surface; and light shield layers configured to shield at least the first light-emitting surfaces of organic light-emitting elements of a portion of the pixel units. The OLED display panel combines the double-faced organic light-emitting elements and the light shield layers to simply achieve double emission display.

10 Claims, 3 Drawing Sheets

(56) References Cited

U.S. PATENT DOCUMENTS

2011/0122500 A1   5/2011  Kobayashi
2011/0181974 A1*  7/2011  Hori et al. .................... 359/891

FOREIGN PATENT DOCUMENTS

| | | |
|---|---|---|
| CN | 102054398 A | 5/2011 |
| CN | 10259314 A | 7/2012 |
| CN | 102646697 A | 8/2012 |
| CN | 203026508 U | 6/2013 |

OTHER PUBLICATIONS

English Translation of First Office Action of the State Intellectual Property Office of the People's Republic of China in Application No. CN201310011540.5, issued Nov. 27, 2014; 7 pgs.
English Abstract of CN102054398A; 1 pg.
English Abstract of CN102646697A; 1 pg.
English Abstract of CN203026508U; 1 pg.
English Abstract of CN1752800A; 1 pg.
English Abstract of CN102593149A; 1 pg.
English Abstract of CN1719957A; 1 pg.

* cited by examiner

ORGANIC LIGHT-EMITTING DIODE (OLED) DISPLAY PANEL

CROSS REFERENCE TO RELATED APPLICATIONS

This application claims priority from Chinese National Application No. 201310011540.5 filed on Jan. 11, 2013, the contents of which are incorporated herein by reference.

TECHNICAL FIELD

The embodiments of the present technical disclosure relate to an organic light-emitting diode (OLED) display panel.

BACKGROUND

With the rapid development of flat-panel display technologies, compared with the traditional liquid crystal displays (LCDs), OLED displays not only are lighter and thinner but also have the advantages of self-illumination, low power consumption, no backlight required, no limit on viewing angle, high response speed and the like, and have become the mainstream products of the next generation of flat-panel display technology.

An organic light-emitting layer lamination in each pixel unit of a traditional OLED display panel may include: a substrate, a transparent anode for hole injection, an organic layer formed by organic molecules or organic polymers, a conductive layer for transporting holes from the anode, an emission layer for transporting electrons injected from a cathode, and the cathode for electron injection. The cathode may be transparent or opaque, depending on the type of the organic light-emitting element.

The traditional organic light-emitting elements mainly include a double emission type, a top emission type and a bottom emission type. In the organic light-emitting element of the double emission type, both the cathode and the anode are transparent. As illustrated in FIG. 1A, the organic light-emitting element includes a transparent anode 2, a hole transport layer 3, an emission layer 4, an electron transport layer 5, and a semi-transparent cathode 6, which are formed on a substrate 1 in sequence. In the case of picture display (or light emission), electrons and holes are respectively injected from the cathode 6 and the anode 2, and then meet within the emission layer 4 and are recombined into excitons; and when the excitons jump from the excited state back to the ground state, energy is released in the form of light. As both the cathode and the anode of the organic light-emitting element of the double emission type are transparent, both the upper surface and the lower surface of the organic light-emitting element of the double emission type can emit light. In addition, the light emitting direction of one surface is opposite to that of the other surface, as illustrated in FIG. 1B, resulting in that one surface cannot display information properly. Therefore, the traditional OLED display device usually does not employ the double emission type organic light-emitting element to achieve double-faced display.

As for an OLED display device, in order to achieve double-faced display, two different structures, namely top emission type organic light-emitting elements and bottom emission type organic light-emitting elements, are typically formed in a pixel array of an array substrate respectively for double-faced display. Light of the top emission type organic light-emitting elements is emitted from the transparent cathodes disposed on the top, and hence the pixels including the top emission type organic light-emitting elements can achieve the display of first display contents; light of the bottom emission type organic light-emitting elements is emitted from the transparent cathodes disposed at the bottom, and hence the pixels including the bottom emission type organic light-emitting elements can achieve the display of second display contents. With the combination of the top emission type organic light-emitting elements and the bottom emission type organic light-emitting elements, pixel separation between the picture displayed on the upper surface and the picture displayed on the lower surface can be achieved, and hence the objective of double-faced picture display can be realized. As illustrated in FIG. 1C which is a schematic sectional view of the traditional double emission type OLED display panel, the display panel comprises top emission type organic light-emitting elements 7 and bottom emission type organic light-emitting elements 8; the top emission type organic light-emitting elements 7 and the bottom emission type organic light-emitting elements 8 are combined to form a pixel array which is further disposed between an upper substrate and a lower substrate.

SUMMARY

The embodiments of the present technical disclosure provide a double emission type OLED display panel and a display device, which can avoid the sophisticated configuration, which is obtained by combining organic light-emitting elements with two different structures, to achieve double-faced display and hence can simplify the implementation process.

According to one aspect of the present technical disclosure, a double emission type OLED display panel is provided. The display panel comprises: a plurality of pixel units arranged in an array, in which each pixel unit includes an organic light-emitting element provided with a first light-emitting surface and a second light-emitting surface; and light shield layers configured to shield at least the first light-emitting surfaces of organic light-emitting elements of a portion of the pixel units.

For instance, in the OLED display panel, the light shield layers may further include first light shield layers and second light shield layers, in which the first light shield layers are configured to shield the first light-emitting surfaces of the organic light-emitting elements of a portion of the pixel units, and the second light shield layers are configured to shield the second light-emitting surfaces of the organic light-emitting elements of the remaining pixel units.

For instance, in the OLED display panel, the first light shield layers and the second shield layer respectively may include a plurality of light shield sub-units corresponding to areas where the pixel units are disposed.

For instance, in the OLED display panel, the light shield sub-units of the first light shield layers and the light shield sub-units of the second light shield layers in a same row of pixel units may further be arranged alternately.

For instance, in the OLED display panel, all the pixel units may comprise a first pixel unit group and a second pixel unit group which are staggered, in which the first pixel unit group comprises a same column of pixel units corresponding to the light shield sub-units of the first light shield layers, and the second pixel unit group comprises a same column of pixel units corresponding to the light shield sub-units of the second light shield layers.

For instance, in the OLED display panel, alternatively all the pixel units may comprise a first pixel unit group and a second pixel unit group which are staggered, in which the first pixel unit group comprises a same row of pixel units corresponding to the light shield sub-units of the first light shield layers, and the second pixel unit group comprises a the same row of pixel units corresponding to the light shield sub-units of the second light shield layers.

For instance, the OLED display panel may further comprise a first substrate and a second substrate; the pixel units are formed on one side of the first substrate, facing the second substrate; and the first light shield layers are disposed on one side of the first substrate, facing away from the second substrate.

For instance, in the OLED display panel, the second light shield layers may be disposed on one side of the second substrate, facing away from the pixel units.

For instance, the OLED display panel may further comprise black matrixes arranged between adjacent pixel units For instance, in the OLED display panel, the light shield layers may be reflective.

Further scope of applicability of the present technical disclosure will become apparent from the detailed description given hereinafter. However, it should be understood that the detailed description and specific examples, while indicating preferred embodiments of the technical disclosure, are given by way of illustration only, since various changes and modifications within the spirit and scope of the technical disclosure will become apparent to those skilled in the art from the following detailed description.

BRIEF DESCRIPTION OF THE DRAWINGS

The present technical disclosure will become more fully understood from the detailed description given hereinafter and the accompanying drawings which are given by way of illustration only, and thus are not limitative of the present technical disclosure and wherein.

DETAILED DESCRIPTION

The OLED display panel provided by an embodiment of the present technical disclosure combines double emission type light-emitting elements of the same structure with light shield layers to achieve the double-faced display function, and has a simple structure and can be easily achieved.

The inventor has found in research that: the traditional double emission OLED display panel must employ organic light-emitting elements of two different structures to achieve double-faced display; and as the cathodes and anodes of top emission type organic light-emitting elements and the cathodes and anodes of bottom emission type organic light-emitting elements are made of different materials, array substrates are required to be manufactured respectively, and hence the manufacturing process is complex and sophisticated.

Detailed description will be given below to the OLED display panel provided by an embodiment of the present technical disclosure with reference to the accompanying drawings. The size and the shape of various areas in the accompanying drawings do not reflect the true scale of the device, and are only used for illustration and not intended to limit the content of the present technical disclosure.

Figure 1A:
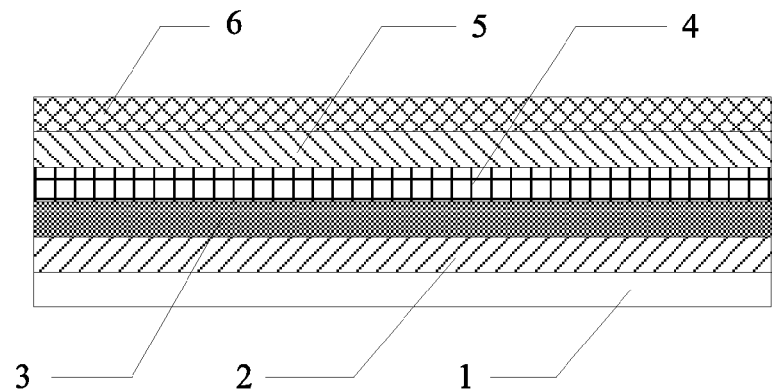
FIG. 1A is a schematic structural sectional view of a traditional double emission type light-emitting element.
Figure 1B:
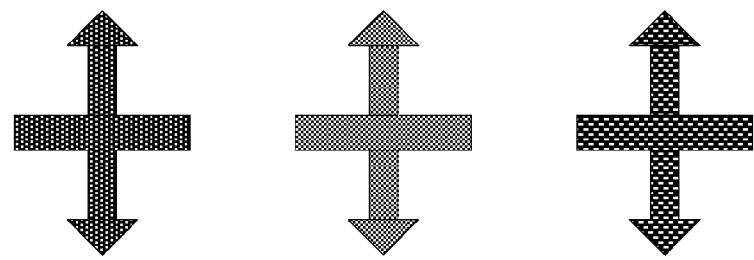
FIG. 1B is a schematic diagram illustrating the light emitting direction of the traditional double emission type light-emitting element.
Figure 1C:
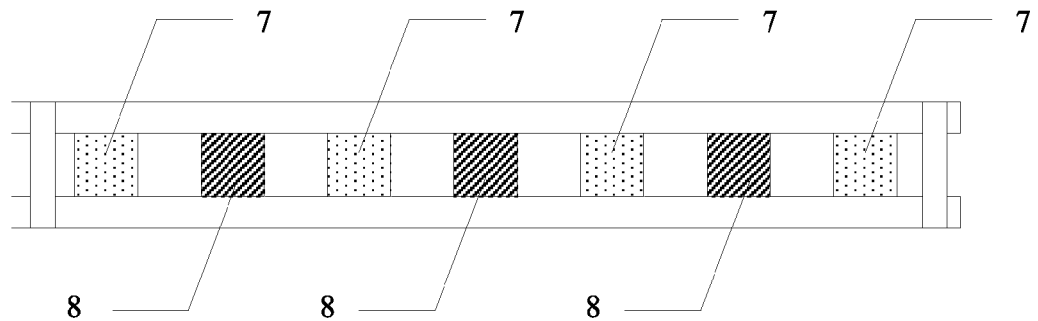
FIG. 1C is a schematic sectional view of a traditional double emission type OLED display panel.
Figure 2A:
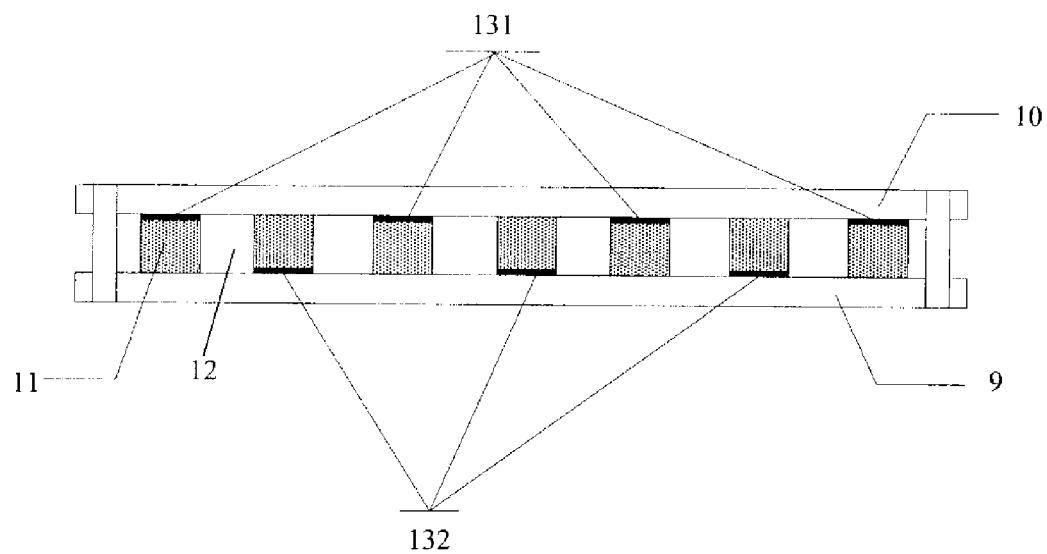
FIG. 2A is a schematic sectional view of a double emission type OLED display panel provided by an embodiment of the present technical disclosure.
Figure 2B:
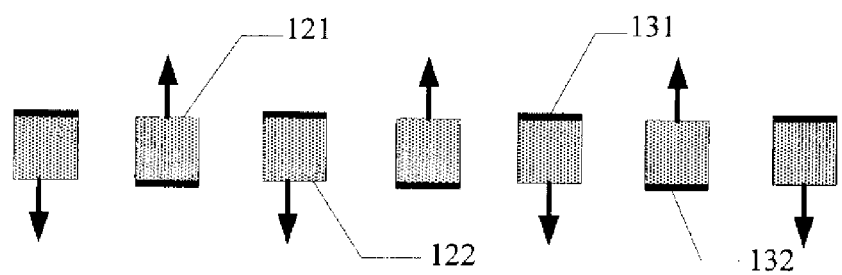
FIG. 2B is a schematic diagram illustrating the implementation of double emission by the double emission type OLED display panel provided by an embodiment of the present technical disclosure.

As illustrated in FIGS. 2A and 2B which are schematic structural views of the double emission type OLED display panel provided by an embodiment of the present technical disclosure, the double emission type OLED display panel comprises a plurality of pixel units 11; the pixel units 11 are isolated from each other, for instance, isolated from each other through a pixel definition layer 12; each pixel unit 11 includes an organic light-emitting element provided with a first light-emitting surface and a second light-emitting surface, namely the organic light-emitting element is of the double emission type; and the pixel units 11 further include light shield layers configured to shield light emitted by the organic light-emitting elements. The light shield layers are configured to shield the first light-emitting surfaces of organic light-emitting elements of a portion of the pixel units. For instance, the second light-emitting surfaces of the organic light-emitting elements of all the pixel units may be not provided with the light shield layers. In this case, some pixel units can conduct double-faced display but some pixel units can conduct single-face display. Therefore, in the case of double-faced display, the second light-emitting surfaces are primary light-emitting surfaces and the first light-emitting surfaces are secondary light-emitting surfaces, and the display brightness of the second light-emitting surfaces is higher than that of the first light-emitting surfaces.

Preferably, for instance, in the double emission type OLED display panel of the embodiment, the light shield layers configured to shield the light emitted by the organic light-emitting elements include first light shield layers 131 and second light shield layers 132; the first light shield layers 131 are configured to shield the first light-emitting surfaces 121 of a corresponding portion of the organic light-emitting elements of the pixel units, and the second light shield layers 132 are configured to shield the second light-emitting surfaces 122 of a corresponding portion of the organic light-emitting elements of corresponding pixel units. Obviously, the first light shield layers 131 and the second light shield layers 132 will not be present in the same pixel units. The first light-emitting surfaces 121 and the second light-emitting surfaces 122 are disposed on opposite side surfaces of the display panel.

More specifically, the double emission type OLED display panel provided by an embodiment of the present technical disclosure comprises: a first substrate 9, a second substrate 10, and a plurality of pixel units 11 disposed between the first substrate 9 and the second substrate 10 and arranged in an array. The organic light-emitting elements for achieving double emission in the pixel array of the embodiment do not employ the combination structure consisting of top emission type organic light-emitting elements and bottom emission type organic light-emitting elements, but employ the double emission type organic light-emitting elements of the same structure in all the pixels. The double emission type organic light-emitting elements are provided with first light-emitting surfaces 121 and second light-emitting surfaces 122.

For instance, in the embodiment of the present technical disclosure, the double emission type organic light-emitting elements may employ the traditional double emission type organic light-emitting elements. In the traditional double emission type organic light-emitting element, the light emitting direction on one surface is opposite to that on the other surface, so that one of the surfaces cannot display information properly. However, in the embodiment, a first light shield layer 131 or a second light shield layers 132 capable of shielding light emitted by one light-emitting surface of the double emission type organic light-emitting element is disposed at an area at which a pixel unit is disposed. The first light shield layers 131 and the second light shield layers 132 can be disposed in corresponding areas in a predetermined way in view of the actually required picture display and respectively configured to shield light emitted from the first light-emitting surfaces 121 and light emitted from the second light-emitting surfaces 122 of the corresponding double emission type organic light-emitting elements. As the first light shield layers 131 are configured to shield the light emitted from the first light-emitting surfaces 121 of organic light-emitting elements in a portion of the pixel units and the second light shield layers 132 are configured to shield the light emitted from second light-emitting surfaces 122 of organic light-emitting elements in the remaining pixel units except the pixel units shielded by the first light shield layers 131, pixel units for achieving the display on different surfaces can be isolated from each other, and hence the double-faced display function can be achieved.

In the OLED display panel provided by an embodiment of the present technical disclosure, the double emission type organic light-emitting elements of the same structure and shield layer structures for respectively shielding the light emitted from different surfaces of the organic light-emitting elements are combined between the upper substrate and the lower substrate to achieve the double-faced display function. Therefore, the OLED display panel has a simple structure and can be easily achieved.

The position and the shape of the first light shield layers and the second light shield layers in the embodiment of the present technical disclosure are not limited as long as the light emitted from the first light-emitting surfaces and the light emitted from the second light-emitting surfaces of the double emission type organic light-emitting elements can be respectively shielded at the corresponding positions of pixel units for achieving double-faced display, so as to achieve pixel separation and hence achieve double-faced display.

In the embodiment of the present technical disclosure, the first light shield layers and the second light shield layers may preferably respectively include a plurality of light shield sub-units, of which the shape is the same with that of the pixel units, and the light shield sub-units correspond to the pixel units and arranged discretely based on the pixel units. With this design, not only the light emitted by the organic light-emitting element in each pixel unit can be shielded but also the usage of the materials can be saved.

The positions of the light shield sub-units of the first light shield layers and the second light shield layers in the embodiment of the present technical disclosure may also be varied. The preferred embodiments are given below for description and not intended to limit the content of the present technical disclosure.

The light shield sub-units of the first light shield layers and the light shield sub-units of the second light shield layers in the same row of pixel units are arranged alternately. The light shield sub-units of the first light shield layers in different rows of pixel units may or may not correspond to the same column of pixel units.

Figure 3:
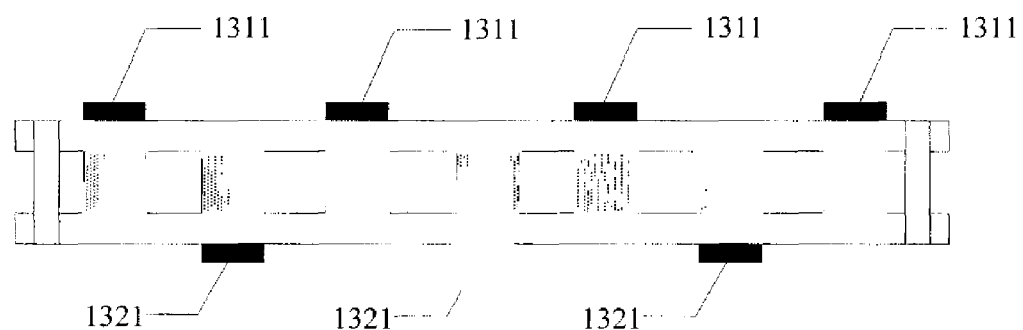
FIG. 3 is a schematic diagram illustrating the alternate arrangement between first light shield layers and second light shield layers in the double emission type OLED display panel provided by an embodiment of the present technical disclosure.

For instance, as illustrated in FIG. 3, all the pixel units comprise a first pixel unit group and a second pixel unit group which are staggered; the first pixel unit group comprises a same column of pixel units corresponding to light shield sub-units 1311 of the first light shield layers 131, and the second pixel unit group comprises a same column of pixel units corresponding to light shield sub-units 1321 of the second light shield layers 132. That is to say, the light shield sub-units 1311 of the first light shield layers 131 and the light shield sub-units 1321 of the second light shield layers 132 are arranged alternately in term of columns. Therefore, the light emitted by the double emission type organic light-emitting elements can be uniformly distributed between rows and columns, and hence the picture display effect can be improved.

For instance, the first pixel unit group may also comprise a same row of pixel units corresponding to the light shield sub-units 1311 of the first light shield layers 131, and the second pixel unit group may also comprise a same row of pixel units corresponding to the light shield sub-units 1321 of the second light shield layers 132. That is to say, the light shield sub-units 1311 of the first light shield layers 131 and the light shield sub-units 1321 of the second light shield layers 132 are arranged alternately in term of rows. Therefore, the light emitted by the double emission type organic light-emitting elements can be uniformly distributed between rows and columns, and hence the picture display effect can be improved.

For instance, in the embodiment of the present technical disclosure, the light shield sub-units 1311 of the first light shield layers 131 may be arranged at odd-numbered rows of a pixel array 11, and the light shield sub-units 1321 of the second light shield layers 132 may be arranged at even-numbered rows of the pixel array 11. Therefore, the staggered and alternate arrangement of both the light shield sub-units 1311 and the light shield sub-units 1321 between different rows can be achieved, and hence pixels at odd even-numbered rows in the display panel are used for displaying first display pictures and pixels at even even-numbered rows in the display panel are used for displaying second display pictures, and consequently the double-faced display function can be achieved and the display effect can be improved. The first display pictures and the second display pictures correspond to the different display contents on the different surface.

In another preferred example of the embodiment of the present technical disclosure, the light shield sub-units 1311 of the first light shield layers 131 may be arranged at odd even-numbered columns of the pixel array 11, and the light shield sub-units 1321 of the second light shield layers 132 may be arranged at even even-numbered columns of the pixel array 11. Therefore, the staggered and alternate arrangement of both the light shield sub-units 1311 and the light shield sub-units 1321 between different columns can be achieved, and hence pixels at odd even-numbered columns in the display panel are used for displaying first display pictures and pixels at even even-numbered columns in the display panel are used for displaying second display pictures, and consequently the double-faced display function can be achieved and the display effect can be improved.

It should be noted that in the embodiment of the present technical disclosure, intervals between the light shield sub-units 1311 of the first light shield layers 131, between the light shield sub-units 1321 of the second light shield layers 132, and between the light shield sub-units 1311 of the first light shield layers 131 and the light shield sub-units 1321 of the second light shield layers 132 are not limited and can be flexibly set according to the pixel distribution condition and the picture display effect.

For instance, in the embodiment of the present technical disclosure, the pixel units 11 are formed on the first substrate 9. At this point, in the embodiment of the present technical disclosure, the first light shield layers 131 for forming the first display pictures may be disposed on one side of the first substrate 9, facing away from the second substrate 10, namely one side of the first substrate 9 not provided with the pixel units 11.

Similarly, the second light shield layers 132 for forming the second display pictures may be preferably disposed on the outside of the second substrate 10, namely one side of the second substrate 10, facing away from the pixel units 11. For details, FIG. 3 may be referred to again.

It should be noted that in the embodiment of the present technical disclosure, the position of the first light shield layers and the second light shield layers may also be varied, for instance, the first light shield layers and the second light shield layers may be disposed on the inside of the first substrate or the second substrate, or at the bottom, on the top or in the middle of the pixel units. In the embodiment of the present technical disclosure, as the structure of the outside of the substrate is simple and the implementation process is relatively easy, the light shield layers are preferably disposed on the outside of the substrates.

Figure 4:
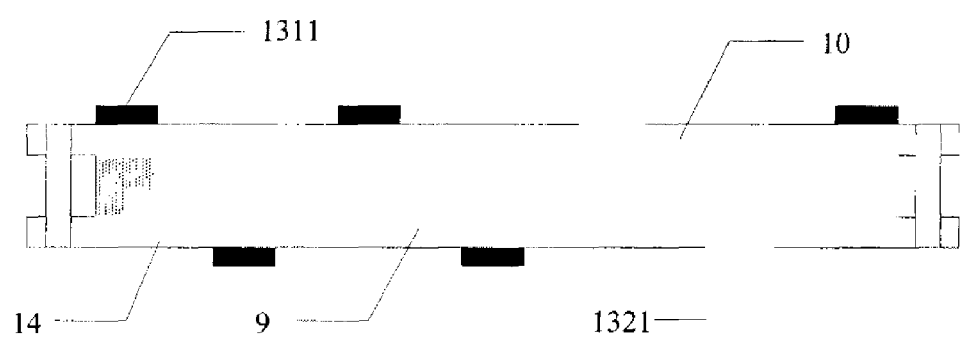
FIG. 4 is a schematic sectional view of the double emission type OLED display panel provided by an embodiment of the present technical disclosure where black matrixes are arranged between adjacent pixels.

In the embodiment of the present technical disclosure, the light shield sub-units 1311 of the first light shield layers 131 are discretely and alternately arranged in term of the pixel units; the light shield sub-units 1321 of the second light shield layers 132 are discretely and alternately arranged in term of the pixel units; and the light shield sub-units 1311 of the first light shield layers 131 and the light shield sub-units 1321 of the second light shield layers 132 are discretely and alternately arranged in term of the pixel units. Therefore, in order to further avoid the problem of optical crosstalk between adjacent pixels, black matrixes 14 may be arranged between adjacent pixels in the embodiment of the present technical disclosure, as illustrated in FIG. 4.

As the black matrixes 14 are arranged between the adjacent pixels in the embodiment of the present technical disclosure, on one hand, the phenomenon of light leakage can be avoided; and on the other hand, the phenomenon of optical crosstalk between the adjacent pixels can be avoided.

Moreover, in the embodiment of the present technical disclosure, the first light shield layers and the second light shield layers may be any shield capable of absorbing or shielding light. In the embodiment of the present technical disclosure, reflective coatings capable of reflecting the light emitted by the double emission type organic light-emitting elements can be further used for the light shield layers. Therefore, on one hand, the light emitted by the double emission type organic light-emitting elements is shielded, and hence the effect of pixel separation can be achieved, and consequently the double-faced display function can be achieved; and on the other hand, as light incident onto the surfaces of the reflective coatings can be reflected back by the reflective coatings and emitted towards the light emission surfaces, the light utilization effect can be improved, and hence the picture display brightness can be improved.

In the embodiment of the present technical disclosure, the reflective surface may be realized with various materials. The reflective surface may be produced by silver plating in a chemical method, for instance, silver mirror reaction, or may be made of any other organic substance or inorganic substance capable of producing reflection. In the embodiment of the present technical disclosure, the reflective coatings are employed for the reflective surfaces (reflectors). The reflective coatings may be prepared when the pixel units are prepared, so that the thickness of the display panel can be reduced. Moreover, a fully-reflected functional material may be also selected, so that the brightness can be further improved, and hence the high-brightness display effect can be achieved.

The embodiment of the technical disclosure being thus described, it will be obvious that the same may be varied in many ways. Such variations are not to be regarded as a departure from the spirit and scope of the technical disclosure, and all such modifications as would be obvious to those skilled in the art are intended to be included within the scope of the following claims.

What is claimed is:

1. An organic light-emitting diode (OLED) display panel, comprising:
    a plurality of pixel units arranged in an array, in which each pixel unit includes an organic light-emitting element provided with a first light-emitting surface and a second light-emitting surface;
    light shield layers configured to shield at least the first light-emitting surfaces of organic light-emitting elements of a portion of the pixel units;
    the light shield layers include first light shield layers and second light shield layers, in which the first light shield layers are configured to shield the first light-emitting surfaces of the organic light-emitting elements of the portion of the pixel units, and the second light shield layers are configured to shield the second light-emitting surfaces of organic light-emitting elements of the remaining pixel units.

2. The OLED display panel according to claim 1, wherein the first light shield layers and the second light shield layers respectively include a plurality of light shield sub-units corresponding to areas where the pixel units are disposed.

3. The OLED display panel according to claim 2, wherein the light shield sub-units of the first light shield layers and the light shield sub-units of the second light shield layers in a same row of pixel units are arranged alternately.

4. The OLED display panel according to claim 2, wherein all the pixel units comprise a first pixel unit group and a second pixel unit group which are staggered, in which the first pixel unit group comprises a same column of pixel units corresponding to the light shield sub-units of the first light shield layers, and the second pixel unit group comprises a same column of pixel units corresponding to the light shield sub-units of the second light shield layers.

5. The OLED display panel according to claim 3, wherein all the pixel units comprise a first pixel unit group and a second pixel unit group which are staggered, in which the first pixel unit group comprises a same column of pixel units corresponding to the light shield sub-units of the first light shield layers, and the second pixel unit group comprises a same column of pixel units corresponding to the light shield sub-units of the second light shield layers.

6. The OLED display panel according to claim 2, wherein all the pixel units comprise a first pixel unit group and a second pixel unit group, in which the first pixel unit group comprises a same row of pixel units corresponding to the light shield sub-units of the first light shield layers, and the second pixel unit group comprises a same row of pixel units corresponding to the light shield sub-units of the second light shield layers.

7. The OLED display panel according to claim 1, further comprising a first substrate and a second substrate;

wherein the pixel units are formed on one side of the first substrate, facing the second substrate; and the first light shield layers are disposed on one side of the first substrate, facing away from the second substrate.

8. The OLED display panel according to claim 7, wherein the second light shield layers are disposed on one side of the second substrate, facing away from the pixel units.

9. The OLED display panel according to claim 1, further comprising black matrixes arranged between adjacent pixel units.

10. The OLED display panel according to claim 1, wherein the light shield layers are reflective.

\* \* \* \* \*